US010644136B2

(12) United States Patent
Bouche et al.

(10) Patent No.: US 10,644,136 B2
(45) Date of Patent: May 5, 2020

(54) MERGED GATE AND SOURCE/DRAIN CONTACTS IN A SEMICONDUCTOR DEVICE

(71) Applicant: GLOBALFOUNDRIES INC., Grand Cayman (KY)

(72) Inventors: Guillaume Bouche, Albany, NY (US); Andy Chih-Hung Wei, Queensbury, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/945,578

(22) Filed: Apr. 4, 2018

(65) Prior Publication Data

US 2018/0233585 A1 Aug. 16, 2018

Related U.S. Application Data

(62) Division of application No. 14/282,089, filed on May 20, 2014, now Pat. No. 9,960,256.

(51) Int. Cl.
*H01L 29/66* (2006.01)
*H01L 29/78* (2006.01)
(Continued)

(52) U.S. Cl.
CPC .. *H01L 29/66795* (2013.01); *H01L 21/76804* (2013.01); *H01L 21/76895* (2013.01);
(Continued)

(58) Field of Classification Search
CPC ........... H01L 29/66795; H01L 29/0847; H01L 29/41791; H01L 29/785
(Continued)

(56) References Cited

U.S. PATENT DOCUMENTS 6,548,394 B1 4/2003 Peng et al.
8,168,983 B2 * 5/2012 Yagi .................... H01L 51/0541
257/40

(Continued)

OTHER PUBLICATIONS

Office Action dated Dec. 29, 2015 in co-pending U.S. Appl. No. 14/282,089, filed May 20, 2014.
(Continued)

*Primary Examiner* — Robert T Huber
(74) *Attorney, Agent, or Firm* — Williams Morgan, P.C.

(57) ABSTRACT

Provided are approaches for forming merged gate and source/drain (S/D) contacts in a semiconductor device. Specifically, one approach provides a dielectric layer over a set of gate structures formed over a substrate; a set of source/drain (S/D) openings patterned in the dielectric layer between the gate structures; a fill material formed over the gate structures, including within the S/D openings; and a set of gate openings patterned over the gate structures, wherein a portion of the dielectric layer directly adjacent the fill material formed within one of the S/D openings is removed. The fill material is then removed, selective to the dielectric layer, and a metal material is deposited over the semiconductor device to form a set of gate contacts within the gate openings, and a set of S/D contacts within the S/D openings, wherein one of the gate contacts and one of the S/D contacts are merged.

16 Claims, 5 Drawing Sheets

(51) Int. Cl.
*H01L 29/08* (2006.01)
*H01L 29/417* (2006.01)
*H01L 29/40* (2006.01)
*H01L 21/768* (2006.01)

(52) U.S. Cl.
CPC .... *H01L 21/76897* (2013.01); *H01L 29/0847* (2013.01); *H01L 29/401* (2013.01); *H01L 29/41791* (2013.01); *H01L 29/66* (2013.01); *H01L 29/785* (2013.01)

(58) Field of Classification Search
USPC .......................................................... 257/401
See application file for complete search history.

(56) References Cited

U.S. PATENT DOCUMENTS

| | | | | |
|---|---|---|---|---|
| 8,889,552 B2* | 11/2014 | Park | ................. | H01L 21/82387 257/384 |
| 2004/0259349 A1 | 12/2004 | Shimizu | | |
| 2012/0319205 A1 | 12/2012 | Hempel et al. | | |
| 2013/0062701 A1 | 3/2013 | Lee et al. | | |
| 2013/0168773 A1 | 7/2013 | Hempel et al. | | |
| 2013/0307088 A1* | 11/2013 | Yang | ................. | H01L 29/66545 257/401 |
| 2014/0004692 A1 | 1/2014 | Wei et al. | | |
| 2014/0038402 A1 | 2/2014 | Wei et al. | | |
| 2014/0015176 A1 | 6/2014 | Hsieh et al. | | |
| 2014/0349476 A1 | 11/2014 | Chen et al. | | |

OTHER PUBLICATIONS

Final Office Action dated May 2, 2016 in co-pending U.S. Appl. No. 14/282,089, filed May 20, 2014.

Office Action dated Jan. 18, 2017 in co-pending U.S. Appl. No. 14/282,089, filed May 20, 2014.

Final Office Action dated Jun. 5, 2017 in co-pending U.S. Appl. No. 14/282,089, filed May 20, 2014.

* cited by examiner

MERGED GATE AND SOURCE/DRAIN CONTACTS IN A SEMICONDUCTOR DEVICE

BACKGROUND

Technical Field

This invention relates generally to the field of semiconductors, and more particularly, to approaches used in forming contacts in semiconductor devices.

Related Art

A typical integrated circuit (IC) chip includes a stack of several levels or sequentially formed layers of shapes. Each layer is stacked or overlaid on a prior layer and patterned to form the shapes that define devices (e.g., fin-type field effect transistors (FinFETs)) and connect the devices into circuits. In a typical state of the art complementary insulated gate FinFET process, such as what is normally referred to as CMOS, layers are formed on a wafer to form the devices on a surface of the wafer. Further, the surface may be the surface of a silicon layer on a silicon on insulator (SOI) wafer. A simple FinFET is formed by the intersection of two shapes, i.e., a gate layer rectangle on a silicon island formed from the silicon surface layer. Each of these layers of shapes, also known as mask levels or layers, may be created or printed optically through well-known photolithographic masking, developing and level definition, e.g., etching, implanting, deposition, etc.

For FinFET devices, it is typical to have a source/drain contact strap over an active region (Rx) to make sure all FINs are connected by contact. Prior art approaches consist of etching a contact hole in the contact strap layer (TS), or contact layer, and then filling the hole with a metal to contact source and drain. The shape of the contact plug is dictated by the shape of the hole, which is usually tapered, yet close to vertical. However, with the current tapered shape of contacts to source and drain, it becomes difficult to expect yield for a contact that allows contact resistance in specification, while avoiding bridging at the top of adjacent contacts.

Another issue with current art approaches is performing a uniform, repeatable contact to the S/D areas. With FinFET technology, a contact area typically encompasses a number of fins. Because of process variability and design rules constraints related to crowding at the top of the contacts, design becomes problematic at 14 nm and smaller because the fin located on the edge of the contact receives only partial coverage with the contact metal, thus resulting in an increased resistance.

In another prior art approach, middle of line (MOL) processing for 14 nm FinFET fully encapsulates the gate in nitride. A contact to S/D is etched through oxide, selectively to nitride (TS level). This contact is therefore self-aligned. After TS metallization and CMP, an Inter-Layer Dielectric (ILD) film is deposited, and the S/D contact to TS and gate contact are processed.

In yet another prior art approach, a replacement metal contact scheme is used for contact to S/D at 10XM dimensions because the requirements in terms of overlay for the S/D triple patterning are too stringent to expect yield otherwise. However, this prevents the processing of contact(s) to gate before the S/D contacts, as is the case with 14XM. Furthermore, this integration degrades the critical dimensions (CD) when stripping the dummy organic planarizing layer (OPL) filling the S/D contact cavity.

SUMMARY

In general, provided are approaches for forming merged gate and source/drain (S/D) contacts in a semiconductor device (e.g., a FinFET). Specifically, one approach provides a dielectric layer (e.g., silicon oxycarbide) over a set of gate structures formed over a substrate; a set of source/drain (S/D) openings patterned in the dielectric layer between the gate structures; a fill material (e.g., a deep ultraviolet light absorbing oxide) formed over the gate structures, including within the S/D openings; and a set of gate openings patterned over the gate structures, wherein a portion of the dielectric layer directly adjacent the fill material within one of the S/D openings is removed. The fill material is then removed, selective to the dielectric layer, and a metal material is deposited over the semiconductor device to form a set of gate contacts within the gate openings and a set of S/D contacts within the S/D openings, wherein one of the gate contacts and one of the S/D contacts are merged.

One aspect of the present invention includes a method of forming a semiconductor device, the method comprising: providing a dielectric layer over a set of gate structures formed over a substrate; patterning a set of source/drain (S/D) openings in the dielectric layer between the set of gate structures; forming a fill material over the set of gate structures, including within the set of S/D openings; patterning a set of gate openings over the set of gate structures, wherein a portion of the dielectric layer directly adjacent the fill material within one of the set of S/D openings is removed; and removing the fill material selective to the dielectric layer.

Another aspect of the present invention includes a method for forming merged gate and source/drain (S/D) contacts in a semiconductor device, the method comprising: providing a dielectric layer over a set of gate structures formed over a substrate; patterning a set of source/drain (S/D) openings in the dielectric layer between the set of gate structures; forming a deep ultraviolet light absorbing oxide (DUO) fill over the set of gate structures, including within the set of S/D openings; patterning a set of gate openings over the set of gate structures, wherein a portion of the dielectric layer directly adjacent the DUO fill within one of the set of S/D openings is removed; and removing the DUO fill selective to the dielectric layer.

Another aspect of the present invention includes a semiconductor device including merged gate and source/drain (S/D) contacts, the semiconductor device comprising: a set of gate structures formed over a substrate; a set of source/drain (S/D) openings patterned in a dielectric layer between the set of gate structures; and a set of gate openings patterned over the set of gate structures, wherein at least one of the set of gate openings and at least one of the set of S/D openings are merged.

BRIEF DESCRIPTION OF THE DRAWINGS

These and other features of this invention will be more readily understood from the following detailed description of the various aspects of the invention taken in conjunction with the accompanying drawings in which.

Figure 1:
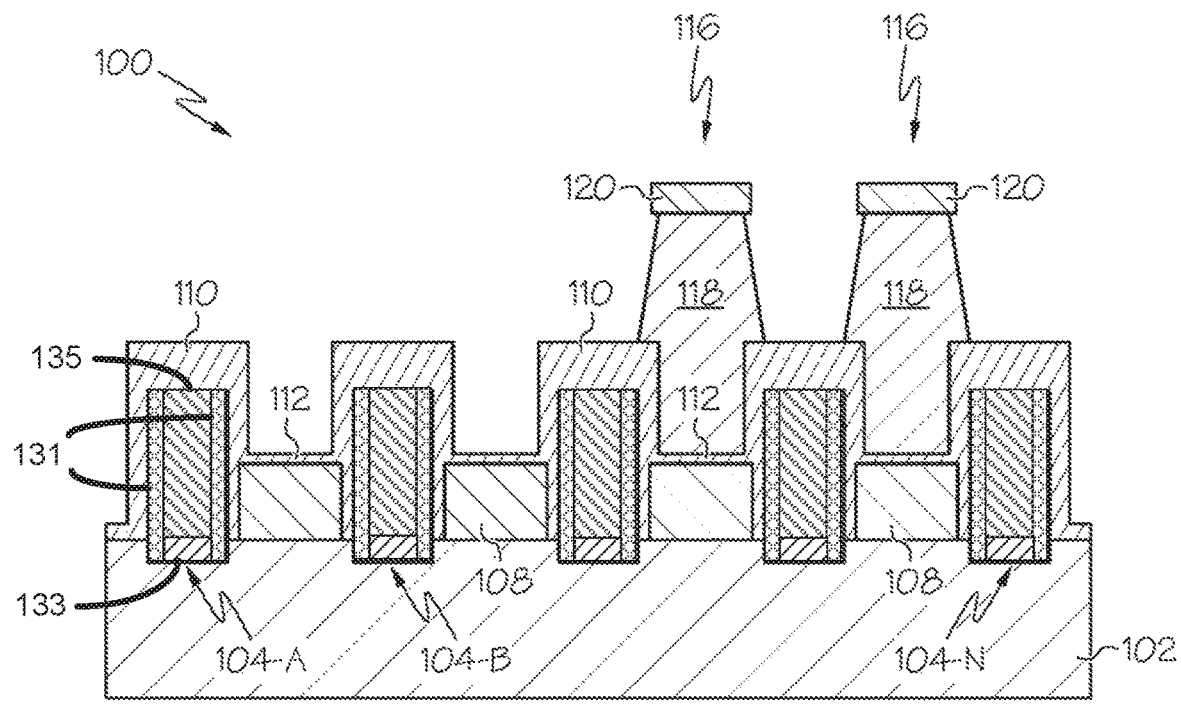
FIG. 1 shows a side cross-sectional view of a set of contact placeholders and a set of gate structures following a first S/D etch according to illustrative embodiments.

The drawings are not necessarily to scale. The drawings are merely representations, not intended to portray specific parameters of the invention. The drawings are intended to depict only typical embodiments of the invention, and therefore should not be considered as limiting in scope. In the drawings, like numbering represents like elements.

Furthermore, certain elements in some of the figures may be omitted, or illustrated not-to-scale, for illustrative clarity. The cross-sectional views may be in the form of "slices", or "near-sighted" cross-sectional views, omitting certain background lines, which would otherwise be visible in a "true" cross-sectional view, for illustrative clarity. Furthermore, for clarity, some reference numbers may be omitted in certain drawings.

DETAILED DESCRIPTION

Exemplary embodiments will now be described more fully herein with reference to the accompanying drawings, in which one or more approaches are shown. It will be appreciated that this disclosure may be embodied in many different forms and should not be construed as limited to the exemplary embodiments set forth herein. Rather, these exemplary embodiments are provided so that this disclosure will be thorough and complete and will fully convey the scope of this disclosure to those skilled in the art. The terminology used herein is for the purpose of describing particular embodiments only and is not intended to be limiting of this disclosure. For example, as used herein, the singular forms "a", "an", and "the" are intended to include the plural forms as well, unless the context clearly indicates otherwise. Furthermore, the use of the terms "a", "an", etc., do not denote a limitation of quantity, but rather denote the presence of at least one of the referenced items. It will be further understood that the terms "comprises" and/or "comprising", or "includes" and/or "including", when used in this specification, specify the presence of stated features, regions, integers, steps, operations, elements, and/or components, but do not preclude the presence or addition of one or more other features, regions, integers, steps, operations, elements, components, and/or groups thereof.

Reference throughout this specification to "one embodiment," "an embodiment," "embodiments," "exemplary embodiments," or similar language means that a particular feature, structure, or characteristic described in connection with the embodiment is included in at least one embodiment of the present invention. Thus, appearances of the phrases "in one embodiment," "in an embodiment," "in embodiments" and similar language throughout this specification may, but do not necessarily, all refer to the same embodiment.

The terms "overlying" or "atop", "positioned on" or "positioned atop", "underlying", "beneath" or "below" mean that a first element, such as a first structure, e.g., a first layer, is present on a second element, such as a second structure, e.g. a second layer, wherein intervening elements, such as an interface structure, e.g. interface layer, may be present between the first element and the second element.

As used herein, "depositing" may include any now known or later developed techniques appropriate for the material to be deposited including but not limited to, for example: chemical vapor deposition (CVD), low-pressure CVD (LPCVD), plasma-enhanced. CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metal-organic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation, etc.

As stated above, embodiments herein provide approaches for forming merged gate and source/drain (S/D) contacts in a semiconductor device (e.g., a FinFET). Specifically, one approach provides a dielectric layer (e.g., silicon oxycarbide (SiOC)) over a set of gate structures formed over a substrate; a set of source/drain (S/D) openings patterned in the dielectric layer between the gate structures; a fill material (e.g., a deep ultraviolet light absorbing oxide) formed over the gate structures, including within the S/D openings; and a set of gate openings patterned over the gate structures, wherein a portion of the dielectric layer directly adjacent the fill material within one of the S/D openings is removed. The fill material is then removed, selective to the dielectric layer, and a metal material is deposited over the semiconductor device to form a set of gate contacts within the gate openings, and a set of S/D contacts within the S/D openings, wherein one of the gate contacts and one of the S/D contacts are merged. As such, these approaches enable the use of DUO instead of OPL, which is beneficial because DUO possesses the benefit to behave like an oxide at dry etch, thus allowing for stitching (i.e., electrically connecting) the gate contact to the S/D contact. Furthermore, these approaches do not suffer from degraded CD, e.g., when stripping the DUO material within the S/D openings due to the use of the SiOC interlayer dielectric.

With reference now to the figures, FIG. 1 shows a semiconductor device 100 (e.g., a FinFET device) having a substrate 102 and a set of gate structures 104A-N (e.g., replacement metal gates (RMG)) formed over substrate 102. Device 100 further comprises a set of fins 108 patterned from substrate 102.

The term "substrate" used herein is intended to include a semiconductor substrate, a semiconductor epitaxial layer deposited or otherwise formed on a semiconductor substrate and/or any other type of semiconductor body, and all such structures are contemplated as falling within the scope of the present invention. For example, the semiconductor substrate may comprise a semiconductor wafer (e.g., silicon, SiGe, or an SOI wafer) or one or more die on a wafer, and any epitaxial layers or other type semiconductor layers formed thereover or associated therewith. A portion or the entire semiconductor substrate may be amorphous, polycrystalline, or single-crystalline. In addition to the aforementioned types of semiconductor substrates, the semiconductor substrate employed in the present invention may also comprise a hybrid oriented (HOT) semiconductor substrate in which the HOT substrate has surface regions of different crystallographic orientation. The semiconductor substrate may be doped, undoped, or contain doped regions and undoped regions therein. The semiconductor substrate may contain regions with strain and regions without strain therein, or contain regions of tensile strain and compressive strain.

Gate structures 104A-N are shown following a self-aligned contact (SAC) SiN CMP and RMG formation process in which each gate structure 104A-N is opened and then filled with a recessed gate dielectric 133 (e.g., HfO2 as gate dielectric) and metal stack 135 (e.g., TiN and W as gate metal), inside the cavity bordered by sidewall spacers 131 (e.g., SiN or SiOCN low k), followed by a capping layer 110 (e.g., SiN or SiOCN low k). Capping layer 110 is formed by recessing with etch the metal gate then depositing SiN followed by chemical mechanical planarization (CMP). As understood to those skilled in the art, the CMP process involves contacting a material layer to be polished with a rotating polishing pad. An abrasive slurry comprising an abrasive suspended in an aqueous solution, which may also contain chemical constituents to achieve selectivity, is disposed between the polishing pad and the material layer to be polished. The material layer to be polished is then polished away with the polish pad and slurry to achieve a desired removal.

Fins 108 may be fabricated using any suitable process including one or more photolithography and etch processes. The photolithography process may include forming a photoresist layer (not shown) overlying substrate 102 (e.g., on a silicon layer), exposing the resist to a pattern, performing post-exposure bake processes, and developing the resist to form a masking element including the resist. The masking element may then be used to etch fins 108 into the silicon layer, e.g., using reactive ion etch (RIE) and/or other suitable processes. In one embodiment, fins 108 are formed using a sidewall image transfer technique. In yet another embodiment, fins 108 are formed by a double-patterning lithography (DPL) process. DPL is a method of constructing a pattern on a substrate by dividing the pattern into two interleaved patterns. DPL allows enhanced feature (e.g., fin) density. Various DPL methodologies may be used including, but not limited to, double exposure (e.g., using two mask sets), forming spacers adjacent features and removing the features to provide a pattern of spacers, resist freezing, and/or other suitable processes.

The resulting structure includes set of fins 108 having sidewalls being substantially orthogonal to a top surface of substrate 102. In an alternative embodiment, fins 108 may be epitaxially grown from a top surface of substrate 102 within trenches or openings formed in a patterned layer atop substrate 102. Fins 108 serve as the fin structure for device 100. The FinFET device may comprise a single fin or multiple fins. As shown in FIG. 1, a nitride capping layer 112 is formed atop each of tins 108 after the gate RMG process so as to act as a Contact Etch Stop Layer (CESL) during further processing of the source/drain contact etch.

As further shown, device 100 comprises a set of contact placeholders 116 following a first S/D etch. In this embodiment, each of contact placeholders 116 includes an oxide layer, for instance a tetra ethyl ortho silicate (TEOS) 118 beneath a nitride layer 120. In various embodiments, contact placeholders 116 are formed (e.g., patterned from a set of layers) using one or more lithography and etch processes.

Although not specifically shown for the sake of brevity, semiconductor 100 further includes a set of S/D features formed on opposite sides of a channel region. The S/D features may be formed by recessing a portion of substrate 102 to form source/drain recessing trenches and epitaxially growing a semiconductor material layer in the sources/drains recessing trenches. The semiconductor material layer includes element semiconductor material such as germanium (Ge), silicon (Si), or compound semiconductor materials, such as gallium arsenide (GaAs), aluminum gallium arsenide (AlGaAs); or semiconductor alloy, such as silicon germanium (SiGe), or gallium arsenide phosphide (GaAsP). The epitaxial processes include CVD deposition techniques (e.g., vapor-phase epitaxy (VPE) and/or ultra-high vacuum CVD (UHV-CVD)), molecular beam epitaxy, and/or other suitable processes. The S/D features may be formed by one or more epitaxy or epitaxial (epi) processes. The S/D features may be in-situ doped during the epi process. For example, the epitaxially grown SiGe S/D features may be doped with boron; and the epitaxially grown Si epi S/D features may be doped with carbon to form Si:C source/drain features, phosphorous to form Si:P source/drain features, or both carbon and phosphorous to form SiCP source/drain features. In one embodiment, the S/D features are not in-situ doped. Instead, an implantation process (i.e., a junction implant process) is performed to dope the S/D features. One or more annealing processes may be performed to activate the source/drain epitaxial feature. The annealing processes comprise rapid thermal annealing (RTA) and/or laser annealing processes.

Figure 2:
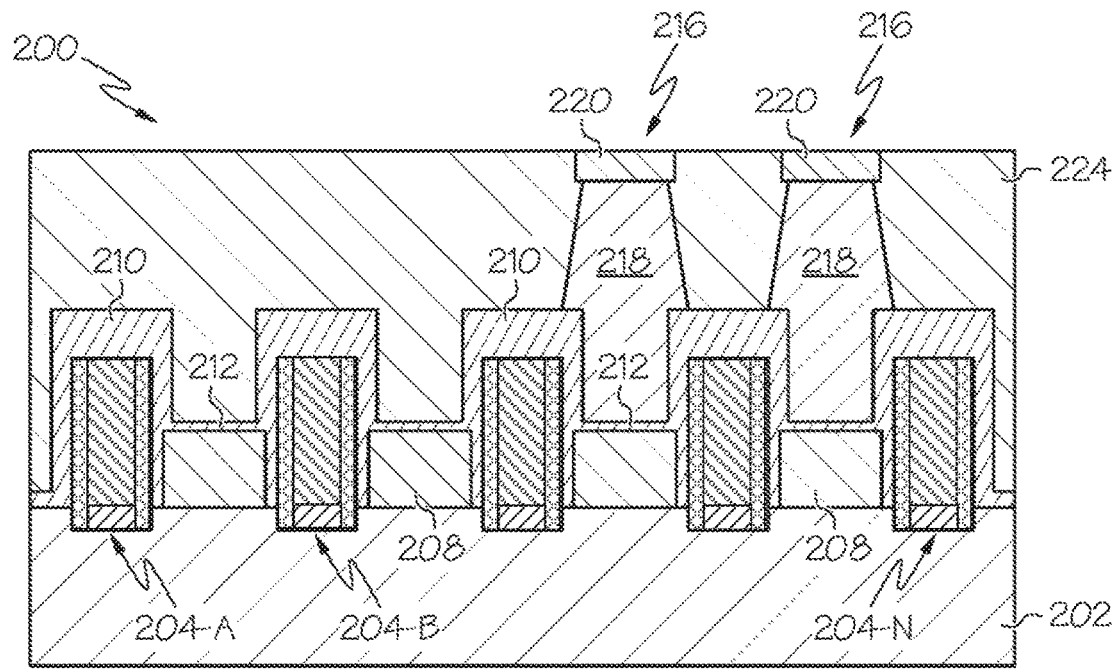
FIG. 2 shows a side cross-sectional view of the semiconductor device following formation of a dielectric layer over the set of gate structures according to illustrative embodiments.

FIG. 2 shows semiconductor device 200 following deposition and etch back (or CMP) of a dielectric layer 224 (e.g., a flowable chemical vapor deposited (FCVD) insulator such as silicon oxycarbide (SiOC)) over set of gate structures 204A-N according to illustrative embodiments. As shown, dielectric layer 224 is removed selective to nitride 220 of contact placeholders 216.

Figure 3:
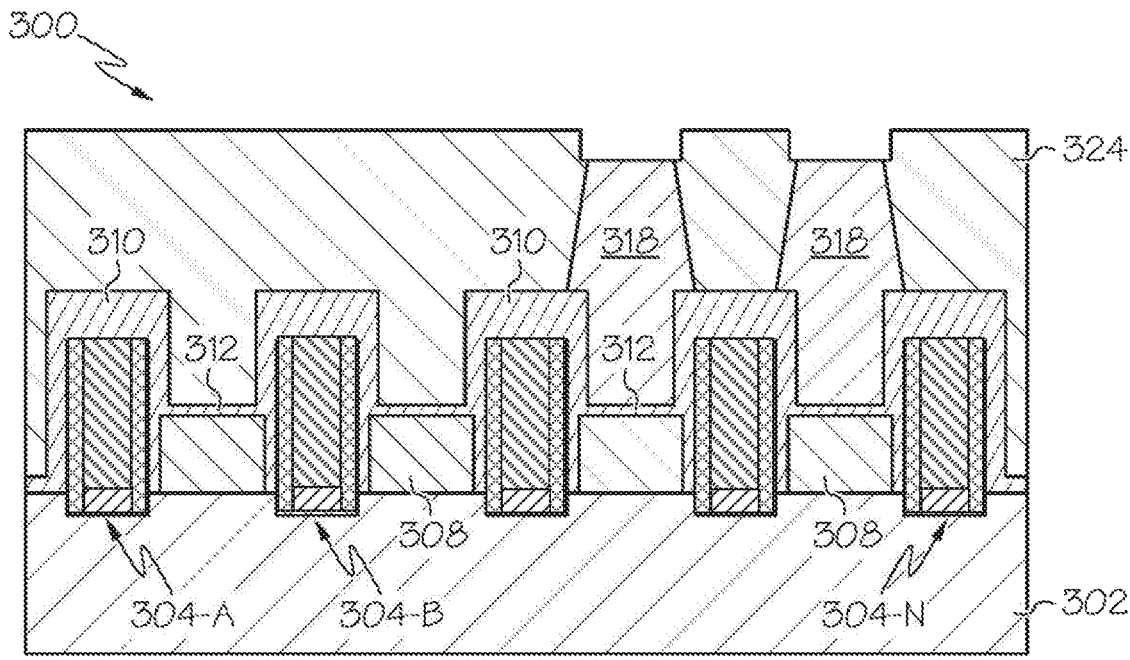
FIG. 3 shows a side cross-sectional view of the semiconductor device following removal of a portion of the set of contact placeholders according to illustrative embodiments.
Figure 4:
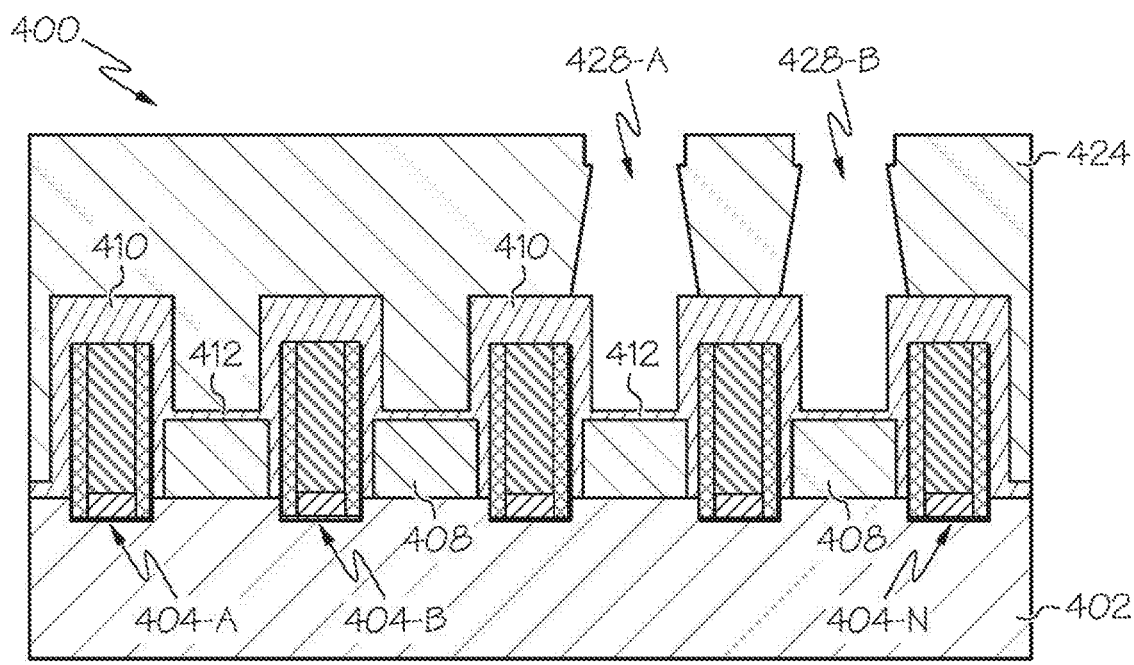
FIG. 4 shows a side cross-sectional view of the semiconductor device following removal of the remaining portion of the set of contact placeholders according to illustrative embodiments.

FIG. 3 shows semiconductor device 300 following removal of nitride 220 (FIG. 2) according to illustrative embodiments. In an exemplary embodiment, the nitride atop TEOS 318 is removed using a deglaze and hot phosphoric (hot phos) acid process so as to selectively etch the nitride with respect to the SiOC dielectric layer 324. TEOS 318 is then removed (e.g., via a wet oxide removal process selective to SiOC and SiN, for instance in a diluted hydrofluoric acid (dHF) solution) to form a set of S/D openings 428A-B, as shown in FIG. 4. The carbon content of dielectric layer 324 makes it impervious to the dHF wet etch (unlike standard SiO2, which is not).

Figure 5:
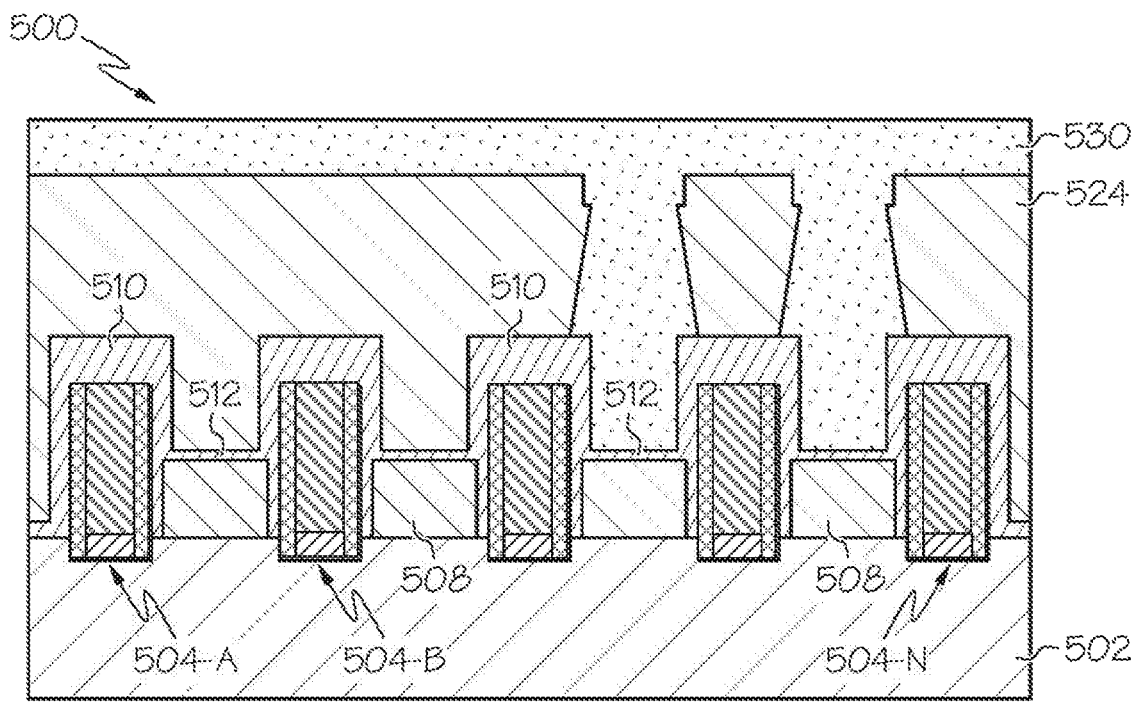
FIG. 5 shows a side cross-sectional view of the semiconductor device following deposition of a fill material according to illustrative embodiments.

FIG. 5 shows semiconductor device 500 following deposition of a self-planarizing fill material 530. In an exemplary embodiment, fill material 530 comprises a deep ultraviolet light absorbing oxide (DUO) formed over gate structures 504A-N, including within gate openings 428A-B (FIG. 4).

Figure 6:
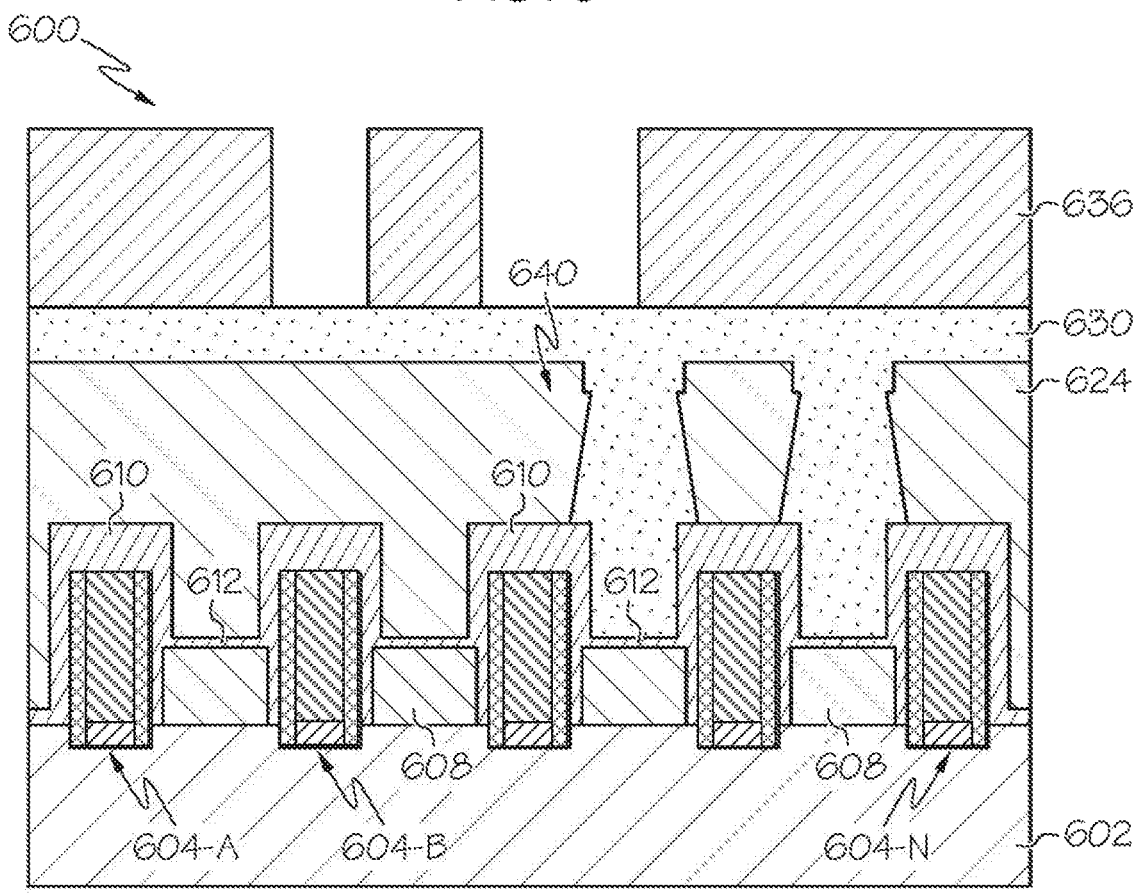
FIG. 6 shows a side cross-sectional view of the semiconductor device following formation of a patterned lithography mask according to illustrative embodiments.
Figure 7:
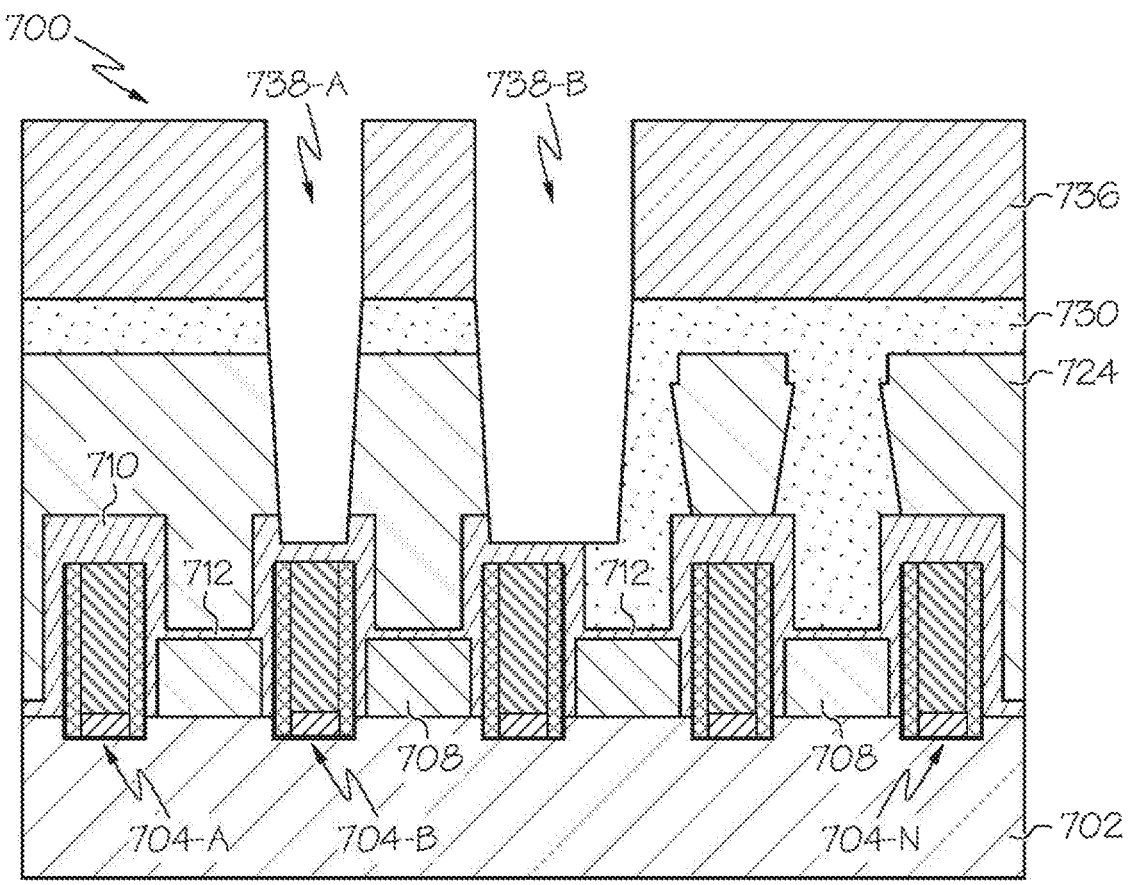
FIG. 7 shows a side cross-sectional view of the semiconductor device following formation of a set of gate openings according to illustrative embodiments.

Next, a patterned lithography layer 636 is formed over device 600, as shown in FIG. 6. Lithography layer 636 has a set of openings used to pattern a set of gate openings 738A-B over set of gate structures 704A-N, as shown in FIG. 7. In this embodiment, gate openings 738A-B are formed using a RIE, resulting in a partial etch to capping layers 710 atop one or more of gate structures 704A-N (e.g., gate structure 704-B). As shown, gate opening 738-B exposes fill material 730 formed within one of the S/D openings by removing a portion 640 (FIG. 6) of dielectric layer 724 directly adjacent fill material 730. In an exemplary embodiment, each gate opening 738A-B has sloped sidewalls that converge/narrow towards set of gate structures 704A-N.

Figure 8:
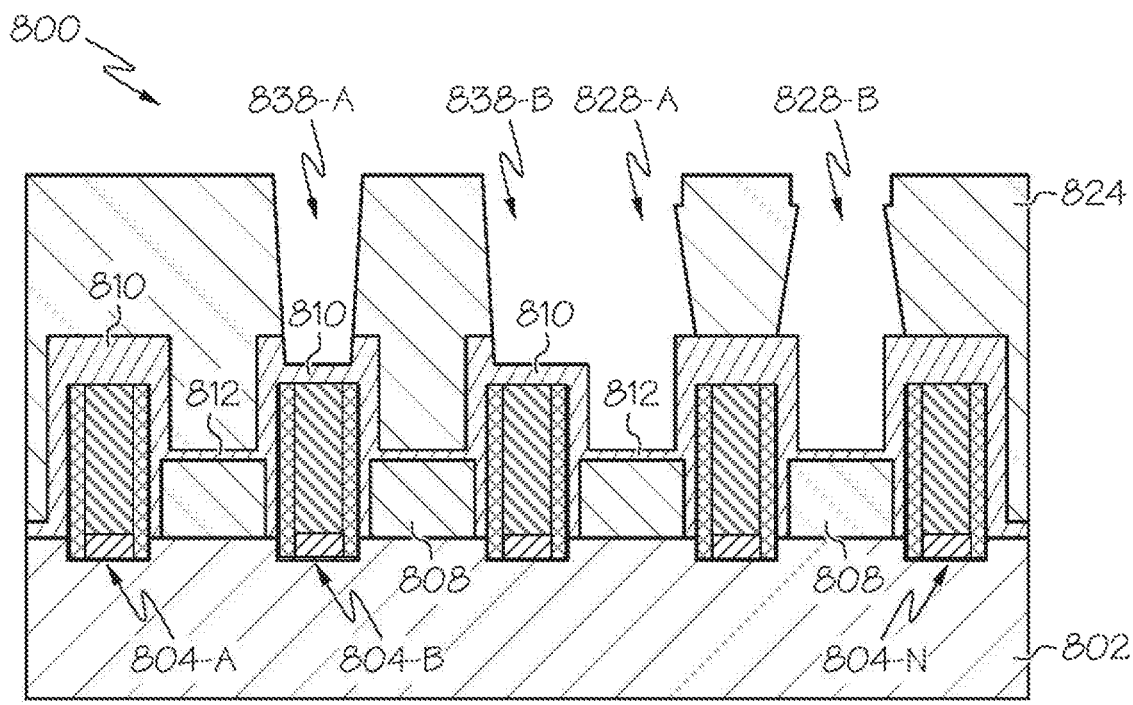
FIG. 8 shows a side cross-sectional view of the semiconductor device following removal of the fill material selective to the dielectric material.

Fill material 730 is then removed, as demonstrated by device 800 of FIG. 8. In this embodiment, the fill material (e.g., DUO) is removed selective to SiOC dielectric layer 824 using an O2 plasma (ash process). In an exemplary embodiment, the fill material comprises DUO, which is beneficial because DUO possesses the characteristics to behave like an oxide at etch, thus allowing for stitching (i.e., electrically connecting) gate and S/D contacts following metallization. DUO behaves like SIO2 (or SiOC) during dry etch (e.g., RIE), yet can be selectively removed by ash. Furthermore, device 800 does not suffer from degraded CD, e.g., when stripping the DUO material within the S/D openings 828A-B.

Figure 9:
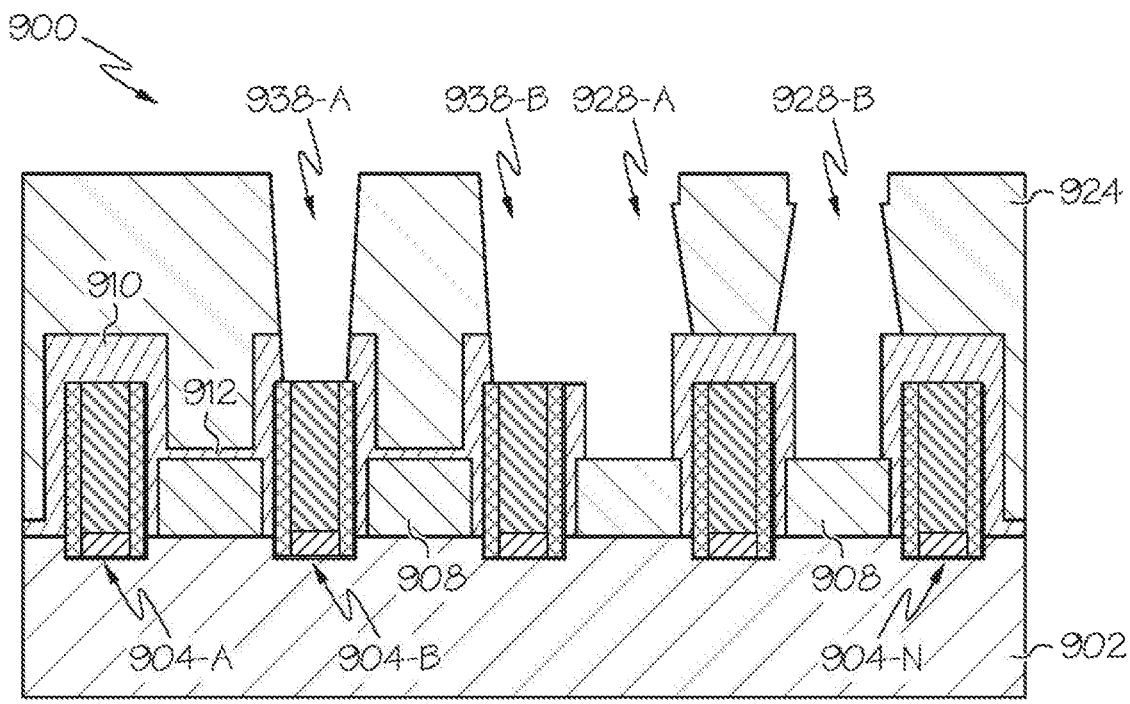
FIG. 9 shows a side cross-sectional view of the semiconductor device following removal of a capping layer from atop the set of gate structures within the set of gate openings and from atop a set of fins within the set of S/D openings according to illustrative embodiments.

Next, the capping layer is removed from atop set of gate structures 804A-N (i.e., SiN capping layer 810) within set of gate openings 838A-B, and from atop set of fins 808 (i.e., CESL 812) within S/D openings 828A-B to uncover the Si and SiGe of the source/drain, resulting in device 900 shown in FIG. 9.

Figure 10:
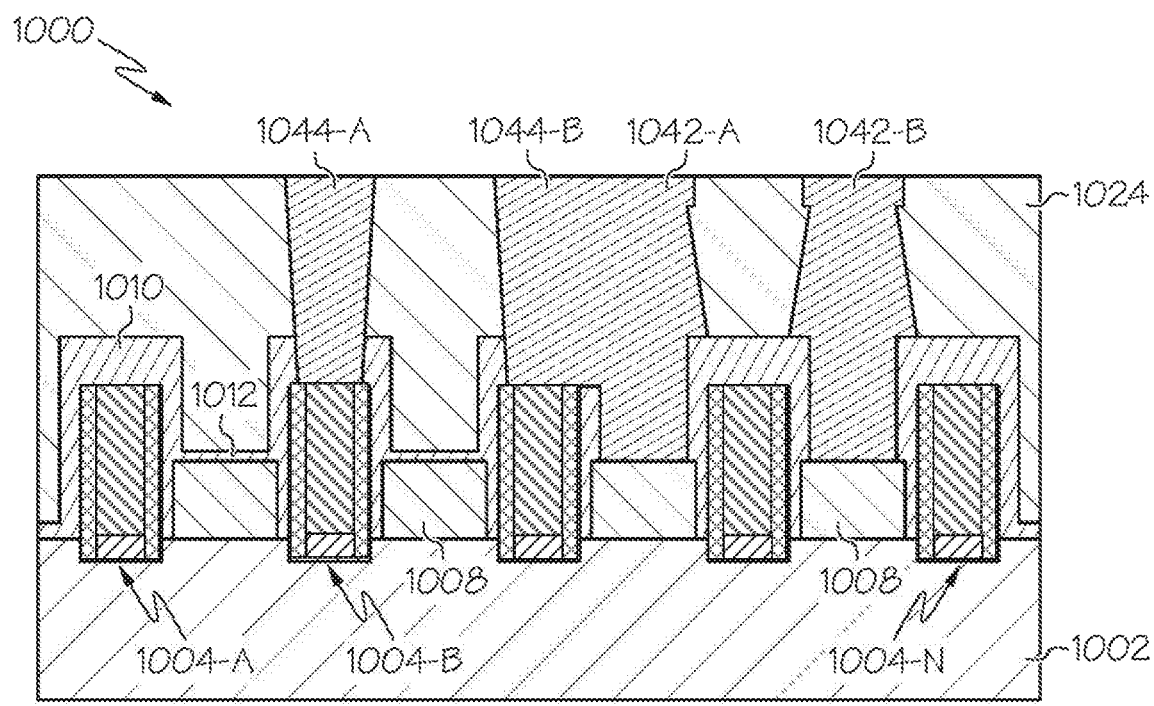
FIG. 10 shows a side cross-sectional view of the semiconductor device following deposition of metal material to form a set of gate contacts within the set of gate openings and a set of S/D contacts within the set of S/D openings according to illustrative embodiments.

FIG. 10 shows semiconductor device 1000 following deposition and planarization of a metal material. The metal material may be formed of a thin liner of Ti/TiN (e.g., with thickness in the range of 1 to 4 nm) and a metal fill consisting of CVD W or Co, for instance. As shown, semiconductor device 1000 includes a set of S/D contacts 1042A-B and a set of gate contacts 1044A-B, wherein at least one of S/D contacts 1042A-B is merged with at least one of gate contacts 1044A-B. In this embodiment, S/D contact 1042-A and gate contact 1044-B are stitched (i.e., directly electrically connected).

In various embodiments, design tools can be provided and configured to create the datasets used to pattern the semiconductor layers as described herein. For example data sets can be created to generate photomasks used during lithography operations to pattern the layers for structures as described herein. Such design tools can include a collection of one or more modules and can also be comprised of hardware, software or a combination thereof. Thus, for example, a tool can be a collection of one or more software modules, hardware modules, software/hardware modules or any combination or permutation thereof. As another example, a tool can be a computing device or other appliance on which software runs or in which hardware is implemented. As used herein, a module might be implemented utilizing any form of hardware, software, or a combination thereof. For example, one or more processors, controllers, ASICs, PLAs, logical components, software routines, or other mechanisms might be implemented to make up a module. In implementation, the various modules described herein might be implemented as discrete modules or the functions and features described can be shared in part or in total among one or more modules. In other words, as would be apparent to one of ordinary skill in the art after reading this description, the various features and functionality described herein may be implemented in any given application and can be implemented in one or more separate or shared modules in various combinations and permutations. Even though various features or elements of functionality may be individually described or claimed as separate modules, one of ordinary skill in the art will understand that these features and functionality can be shared among one or more common software and hardware elements, and such description shall not require or imply that separate hardware or software components are used to implement such features or functionality.

It is apparent that there has been provided approaches for forming merged gate and S/D contacts. While the invention has been particularly shown and described in conjunction with exemplary embodiments, it will be appreciated that variations and modifications will occur to those skilled in the art. For example, although the illustrative embodiments are described herein as a series of acts or events, it will be appreciated that the present invention is not limited by the illustrated ordering of such acts or events unless specifically stated. Some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the formation and/or processing of structures illustrated and described herein as well as in association with other structures not illustrated. Therefore, it is to be understood that the appended claims are intended to cover all such modifications and changes that fall within the true spirit of the invention.

What is claimed is:

1. A semiconductor device including merged gate and source/drain (S/D) contacts, the semiconductor device comprising:
    a set of gate structures formed over a substrate, wherein each gate structure comprises a sidewall spacer bordering a gate dielectric and a metal stack;
    a set of source/drain (S/D) openings patterned in a dielectric layer between the set of gate structures;
    a set of gate openings patterned over the set of gate structures, wherein at least one of the set of gate openings and at least one of the set of S/D openings are merged; and
    a capping layer disposed continuously over the set of gate structures, except at a bottom of each gate opening and each S/D opening.

2. The semiconductor device according to claim 1, further comprising:
    a set of gate contacts formed within the set of gate openings; and
    a set of S/D contacts formed within the set of S/D openings, wherein at least one of the set of gate contacts and at least one of the set of S/D contacts are directly electrically connected.

3. The semiconductor device according to claim 1, the semiconductor device further comprising a set of fins, wherein the S/D contacts are formed atop the set of fins.

4. The semiconductor device according to claim 1, the dielectric layer comprising silicon oxycarbide (SiOC).

5. The semiconductor device according to claim 1, wherein each of the set of gate openings has sloped sidewalls that converge towards the set of gate structures.

6. The semiconductor device of claim 1, wherein each of the set of S/D openings has sloped sidewalls that diverge toward the substrate.

7. A semiconductor device, comprising:
a substrate;
a set of fins formed over the substrate;
a set of gate structures formed over the set of fins, wherein each gate structure comprises a sidewall spacer bordering a gate dielectric and a metal stack;
a dielectric layer formed over the set of fins and over and between the set of gate structures;
a set of source/drain (S/D) openings patterned in the dielectric layer between the set of gate structures and to at least one fin of the set of fins;
a set of gate openings patterned in the dielectric layer over the set of gate structures, wherein at least one of the set of gate openings and at least one of the set of S/D openings are merged; and
a capping layer disposed continuously over the set of gate structures and over the set of fins, except at a bottom of each gate opening and each S/D opening.

8. The semiconductor device of claim 7, further comprising:
a set of gate contacts formed within the set of gate openings; and
a set of S/D contacts formed within the set of S/D openings, wherein at least one of the set of gate contacts and at least one of the set of S/D contacts are directly electrically connected.

9. The semiconductor device of claim 7, wherein the dielectric layer comprises silicon oxycarbide (SiOC).

10. The semiconductor device of claim 7, wherein each of the set of gate openings has sloped sidewalls that converge toward the substrate.

11. The semiconductor device of claim 7, wherein each of the set of S/D openings has sloped sidewalls that diverge toward the substrate.

12. A semiconductor device, comprising:
a substrate;
a set of fins formed over the substrate;
a set of gate structures formed over the set of fins, wherein each gate structure comprises a sidewall spacer bordering a gate dielectric and a metal stack;
a dielectric layer formed over the set of fins and over and between the set of gate structures;
a set of source/drain (S/D) openings patterned in the dielectric layer between the set of gate structures and to at least one fin of the set of fins;
a set of gate openings patterned in the dielectric layer over the set of gate structures, wherein at least one of the set of gate openings and at least one of the set of S/D openings are merged;
a set of gate contacts formed within the set of gate openings;
a capping layer disposed continuously over the set of gate structures and over the set of fins, except at a bottom of each gate opening and each S/D opening; and
a set of S/D contacts formed within the set of S/D openings, wherein at least one of the set of gate contacts and at least one of the set of S/D contacts are directly electrically connected.

13. The semiconductor device of claim 12, wherein each of the set of gate openings has sloped sidewalls that converge toward the substrate and each of the set of S/D openings has sloped sidewalls that diverge toward the substrate.

14. The semiconductor device of claim 12, wherein the substrate comprises silicon.

15. The semiconductor device of claim 12, wherein the capping layer comprises nitride and the dielectric layer comprises silicon oxycarbide (SiOC).

16. The semiconductor device of claim 12, wherein the set of gate contacts comprise tungsten or cobalt.

* * * * *